US011988787B2

(12) United States Patent
Royon et al.

(10) Patent No.: US 11,988,787 B2
(45) Date of Patent: May 21, 2024

(54) MULTIPURPOSE FRONT-END BOARD TO CHARACTERIZE SOLID-STATE SENSORS FOR PARTICLE DETECTION

(71) Applicant: University of Kansas, Lawrence, KS (US)

(72) Inventors: Christophe Royon, Lawrence, KS (US); Nicola Minafra, La Plaine (FR)

(73) Assignee: UNIVERSITY OF KANSAS, Lawrence, KS (US)

( * ) Notice: Subject to any disclaimer, the term of this patent is extended or adjusted under 35 U.S.C. 154(b) by 744 days.

(21) Appl. No.: 15/733,977

(22) PCT Filed: May 30, 2019

(86) PCT No.: PCT/US2019/034595
§ 371 (c)(1),
(2) Date: Dec. 1, 2020

(87) PCT Pub. No.: WO2019/232172
PCT Pub. Date: Dec. 5, 2019

(65) Prior Publication Data
US 2021/0373183 A1    Dec. 2, 2021

Related U.S. Application Data

(60) Provisional application No. 62/678,680, filed on May 31, 2018, provisional application No. 62/678,078, filed on May 30, 2018.

(51) Int. Cl.
*G01T 1/24* (2006.01)
*G01R 31/28* (2006.01)
*H03F 3/45* (2006.01)

(52) U.S. Cl.
CPC ............ *G01T 1/24* (2013.01); *G01R 31/2829* (2013.01); *G01R 31/2837* (2013.01);
(Continued)

(58) Field of Classification Search
None
See application file for complete search history.

(56) References Cited

U.S. PATENT DOCUMENTS 3,421,101 A * 1/1969 King ................ H03G 5/10
330/109
5,043,861 A * 8/1991 Diekhans .......... G05B 19/0423
700/11
(Continued)

FOREIGN PATENT DOCUMENTS

WO    2009108334 A2    9/2009
WO    2009108334 A3    9/2009
WO    2010017238 A1    2/2010

OTHER PUBLICATIONS

International Search Report for PCT/US2019/034595 dated Sep. 4, 2019.
(Continued)

*Primary Examiner* — Douglas X Rodriguez
(74) *Attorney, Agent, or Firm* — Thomas | Horstemeyer, LLP

(57) ABSTRACT

A multipurpose front-end board for solid state sensors is described. In particular, the board is optimized for fast timing particle detection or for characterization and test of silicon and diamond detectors that produce a fast but small current signal at the passage of a particle. The multipurpose front-end board includes a sensor pad configured to receive a solid state sensor to be characterized, distribute a bias potential, and read out the current signal produced by the sensor. The board also includes an amplifier configured to read out the current signal from the sensor pad and convert the current signal to an output voltage signal and a discriminator configured to receive the output voltage signal from the amplifier. A threshold voltage of the discriminator can be controlled by a potentiometer, and the board includes at least
(Continued)

one output port to provide data for characterization of the sensor.

18 Claims, 15 Drawing Sheets

(52) U.S. Cl.
CPC ... *H03F 3/45475* (2013.01); *H03F 2200/261* (2013.01); *H03F 2200/408* (2013.01)

(56) References Cited

U.S. PATENT DOCUMENTS

| | | | |
|---|---|---|---|
| 7,818,137 | B2 | 10/2010 | Agarwal et al. |
| 8,278,959 | B2 | 10/2012 | Chua et al. |
| 8,288,657 | B2 | 10/2012 | Choi et al. |
| 8,333,875 | B2 | 12/2012 | Matsuoka et al. |
| 8,630,691 | B2 | 1/2014 | Lamego et al. |
| 8,766,925 | B2 | 7/2014 | Perlin et al. |
| 2008/0185289 | A1* | 8/2008 | Matsuoka .......... G01N 27/4065 |
| | | | 204/425 |
| 2009/0160477 | A1 | 6/2009 | Agarwal et al. |
| 2009/0256817 | A1 | 10/2009 | Perlin et al. |
| 2010/0030039 | A1 | 2/2010 | Lamego et al. |
| 2010/0156451 | A1* | 6/2010 | Chua .................... G01R 31/311 |
| | | | 324/762.01 |
| 2012/0204141 | A1* | 8/2012 | Choi .................... G06F 30/367 |
| | | | 716/127 |

OTHER PUBLICATIONS

Minafra et al. Test of Ultra Fast Silicon Detectors for Picosecond Time Measurements with a New Multipurpose Read-Out Board, 2017 . [retrieved on Jul. 29, 2019). Retrieved from the Internet. <URL: https://arxiv.org/abs/1704.05298>. entire document.

* cited by examiner

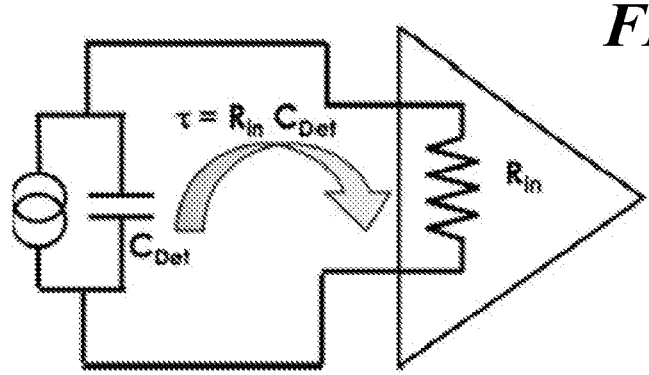
FIG. 7
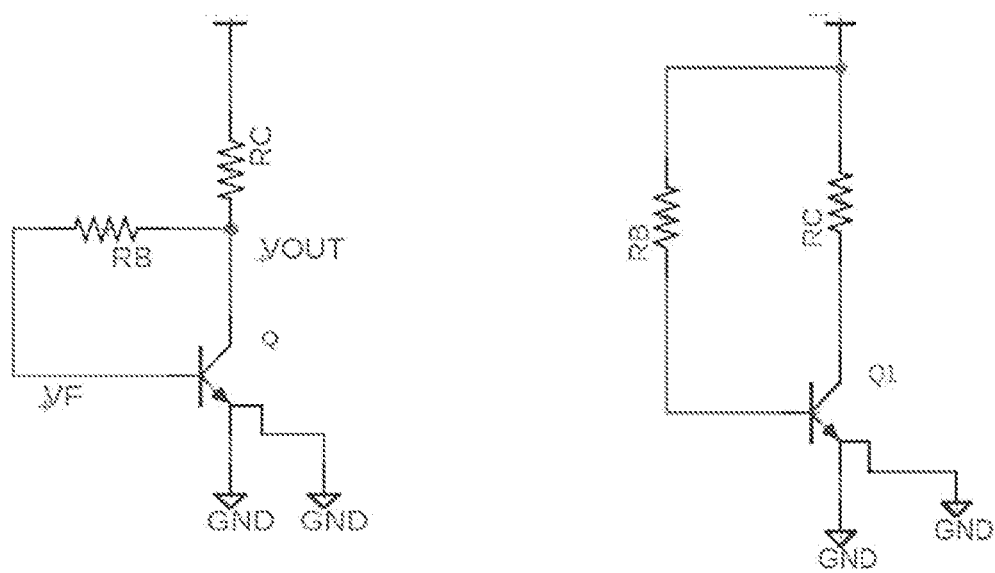
FIG. 8  FIG. 9
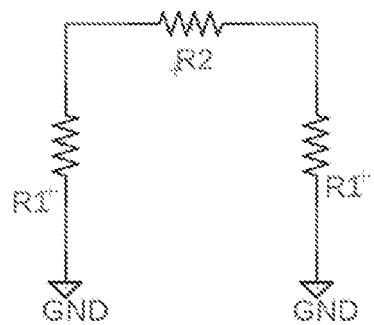
FIG. 10

| Layer | Finished Thickness (inches) | | Finished Copper Weight |
|---|---|---|---|
| Top (Components and voltage) | 0.0014 | | 1 oz |
| Pre-preg | 0.008 | FR4 Dielectric constant 4.15 | |
| Mid-Layer 1 (Ground) | 0.0014 | | 1 oz |
| Core | 0.014 | FR4 Dielectric constant 4.15 | |
| Mid-Layer 2 (Controlled 50 ohm impedance for single ended traces, trace width = 10 mil)(Controlled 100 ohm differential impedance for differential traces, trace width = 8 mil, spacing between traces = 11 mil) | 0.0007 | | 0.5 oz |
| Pre-preg | 0.01 | FR4 Dielectric constant 4.15 | |
| Mid-Layer 3 (Ground) | 0.0014 | | 1 oz |
| Core | 0.014 | FR4 Dielectric constant 4.15 | |
| Mid-Layer 4 (Power 3.3 V) | 0.0014 | | 1 oz |
| Pre-preg | 0.008 | FR4 Dielectric constant 4.15 | |
| Bottom (Ground) | 0.0014 | | 1 oz |
| Total | 0.0617 | | |
| Surface Finish: ENEPIG | | | |

*FIG. 16*

MULTIPURPOSE FRONT-END BOARD TO CHARACTERIZE SOLID-STATE SENSORS FOR PARTICLE DETECTION

CROSS-REFERENCE TO RELATED APPLICATION

This application claims priority to and the benefit of U.S. Provisional Application No. 62/678,078, titled "MULTIPURPOSE FRONT-END BOARD TO CHARACTERIZE SOLID-STATE SENSORS FOR PARTICLE DETECTION," filed on May 30, 2018 and U.S. Provisional Application No. 62/678,680, titled "MULTIPURPOSE FRONT-END BOARD TO CHARACTERIZE SOLID-STATE SENSORS FOR PARTICLE DETECTION," filed on May 31, 2018, the entire contents of which are hereby incorporated by reference herein.

BACKGROUND

Fast timing detectors are more and more common in (High Energy Physics) experimental apparatus. For example, both ATLAS (A Toroidal LHC ApparatuS), CMS (Compact Muon Solenoid), the largest experiments on the Large Hadron Collider (LHC) is the world's largest particle accelerator located near Geneva, Switzerland, use timing detectors as part of their detectors. Moreover, fast timing detectors can be used also outside the HEP community, like for example to detect and identify particles in space, or to help the fine tuning of cancer therapies with radiations.

SUMMARY

Embodiments of the present disclosure are related to an improved design for the testing of solid-state sensors.

According to one exemplary embodiment, among others, a characterization front-end printed circuit board apparatus is provided comprising a sensor pad to mount a particle detection sensor for characterization and provide a current signal produced by the particle detection sensor. The apparatus also includes a multi-stage amplifier electrically coupled to the sensor pad. The multi-stage amplifier can include a first stage amplifier circuit configured to receive the current signal and convert the current signal to a voltage signal and a second stage amplifier circuit configured to receive the voltage signal from the first stage amplifier circuit and produce an amplified voltage signal. The multi-stage amplifier can also include a third stage amplifier circuit configured to receive the amplified voltage signal from the second stage amplifier, the third stage amplifier circuit being configured to invert the amplified voltage signal and produce an output voltage signal. A discriminator can also be included in the apparatus and is electrically coupled to the third stage amplifier circuit. The discriminator configured to receive the output voltage signal and generate characterization data based on a comparison between the output voltage signal and a voltage threshold.

According to one exemplary embodiment, among others, a characterization front-end board is provided comprising a sensor pad configured to house a sensor to be characterized, distribute a bias potential, and communicate a current signal produced by the sensor. The characterization front-end board can also include an amplifier configured to receive the current signal from the sensor pad and convert the current signal to an output voltage signal. A discriminator can be included in the board, in which the discriminator is configured to receive the output voltage signal from the amplifier. A threshold voltage of the discriminator is controlled by a potentiometer. The characterization front-end board also includes at least one output port to provide data for characterization of the sensor.

According to one embodiment, among others, a method of generating characterization data for a sensor is provided. The method includes the step of mounting a sensor for characterization on a sensor pad of a single printed circuit board. The single printed circuit board comprises the sensor pad, an amplifier, and a discriminator. The method also includes the steps of providing, via the sensor pad, a current signal produced by the sensor to an amplifier and converting, via the amplifier, the current signal to a voltage signal. The method can comprise the steps of generating, via the amplifier, an amplified voltage signal by amplifying the voltage signal and generating, via the amplifier, an output voltage signal by inverting the amplifier voltage signal. Additionally, the method includes the step of generating, via the discriminator, data for characterization of the sensor by comparing the output voltage signal and a threshold voltage.

BRIEF DESCRIPTION OF FIGURES

Many aspects of the present disclosure can be better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

FIG. 7 illustrates the concept of using an amplifier with a high input impedance to read out a solid state sensor, like a silicon or a diamond crystal.

FIG. 8 illustrates an example Heterojunction Bipolar Junction Transistor (HBJT) with collector feedback biasing according to various examples described herein.

FIG. 9 illustrates an example HBJT with fixed base biasing according to various examples described herein.

FIG. 10 illustrates an example of a Pi-pad signal attenuator according to various examples described herein.

FIG. 16 illustrates an example stackup of one of the prototypes of the multipurpose front-end circuit board according to various examples described herein.

DETAILED DESCRIPTION

Timing detectors are currently in use in several apparatus of different International Collaborations. As an example, the CMS, TOTEM and ATLAS experiments at the LHC (CERN, Geneva) use timing detectors to complement the information available to properly reconstruct the events following high-energy proton-proton collisions.

The components of a timing detector can include one or more sensors, for example Ultra-Fast Silicon Detector (UFSD), that generate a current pulse at the passage of a particle, one or more trans-impedance amplifiers with shaping, and one or more discriminators, among other components.

The present disclosure includes details regarding the configuration of a multipurpose front-end board, such as Printed Circuit Board (PCB), for sensor characterization. Specifically, the arrangement of components, traces, and stackup are described for a 6-layer PCB that houses these components, as one non-limiting example. The PCB board has been manufactured, and test results were performed to assess the functionality.

Thus, the examples described herein are directed to a system to facilitate the testing of solid-state sensors. Some non-limiting examples of such solid-state sensors include UFSD, low-gain avalanche detectors, and other suitable solid-state sensors. Described herein are various examples of the design of a circuit schematic and board layout for a PCB. The board includes a front-end that houses a sensor pad for a solid state sensor, a transimpedance amplifier with shaping, and a discriminator. The amplifier consists of three stages. The first stage is a preamplification stage that extracts the current signal from the detector and converts it to a voltage signal. The first stage can be configured to pre-amplify the signal, with low contribution of noise and distortion, and provide an input impedance such that the current signal can be extracted from the sensor and used as an input for the amplifier. The next two stages amplify and shape the voltage signal obtained from the first stage to a level that can be used as an input to the discriminator. Preferable discriminators contribute low noise, have LVDS outputs, low power consumption, and high-speed functionality.

Another example of timing detector is using a diamond sensor that can achieve a time precision in the range of 50-100 ps. However, these sensors are expensive, because they require high purity diamonds.

Also disclosed are examples of tests performed to check the functionality of the board. The tests performed include power consumption, noise, DC voltages and currents, and functionality of the discriminators. Although the examples use a UFSD sensor to characterize solid state sensors, the system can be used to assess other sensors for particle detection including diamond, germanium, and other suitable sensors.

Figure 1:
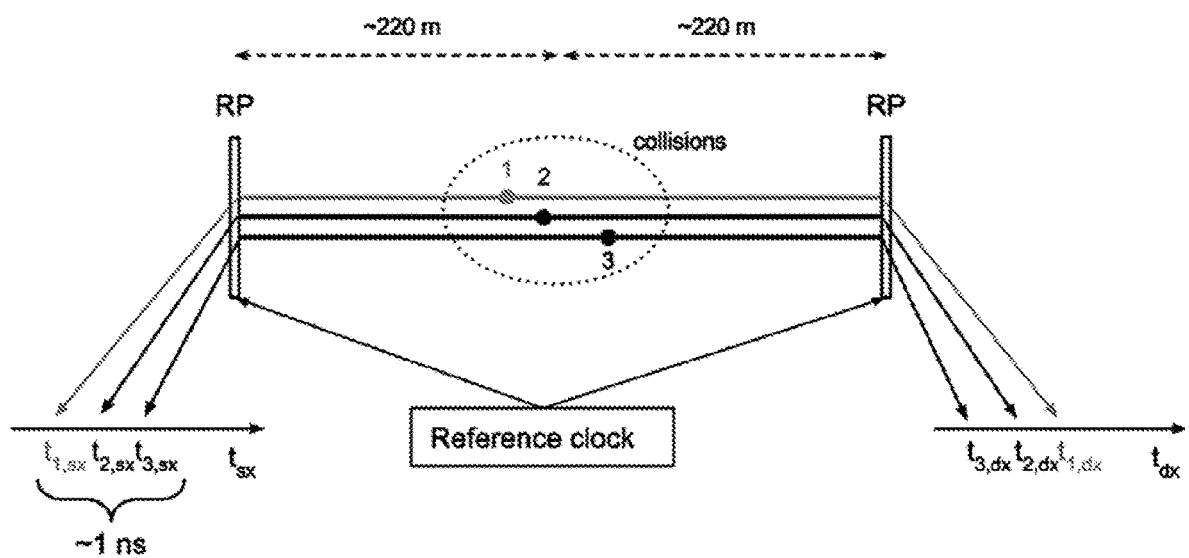
FIG. 1 illustrates an example schematic diagram of the time of arrival of two protons measured on each side of a collision point with respect to a reference clock according to various examples described herein. In this way, the time of arrival of the two protons can be used to measure the longitudinal position of the interactions they underwent.

FIG. 1 illustrates an example timing diagram of an arrival of two protons measured on each side of a collision point with respect to a reference clock. As shown in FIG. 1, the vertex of the interaction is reconstructed by measuring the arrival times of the two protons with respect to a reference clock on the two sides of the interaction point. The reconstruction of the vertex using timing is known as the "z-by-timing" method and is represented as:

$$z = \frac{c(t_1 - t_2)}{2}, \quad (1)$$

where $t_1$ and $t_2$ are the arrival times of the two protons, c is the speed of light, and z is the reconstructed vertex position.

The time precision of the signal obtained from the detector is limited, among other usually smaller factors, by the contribution of the front-end electronics, usually referred as time jitter. It can be approximated to:

$$\sigma_t \approx \sigma_{jitter} = \frac{\sigma_n}{\left(\frac{dV}{dt}\right)_{max}} = \frac{\Delta t_{0.1-0.9}}{\frac{V_{max}}{\sigma_n}} = \frac{\Delta t_{0.1-0.9}}{SNR}, \quad (2)$$

where $\sigma_n$ is the RMS noise, $$\frac{dV}{dt}$$

is the signal slope or slew rate, $\Delta t_{0.1-0.9}$ is the rise time (time required for a signal to rise from 10% to 90% of its maximum value), and $V_{max}$ is the maximum value of the signal. Presently, the time precision of the timing detector is approximately 35-40 ps per detector layer, i.e. per sensor.

Figure 2:
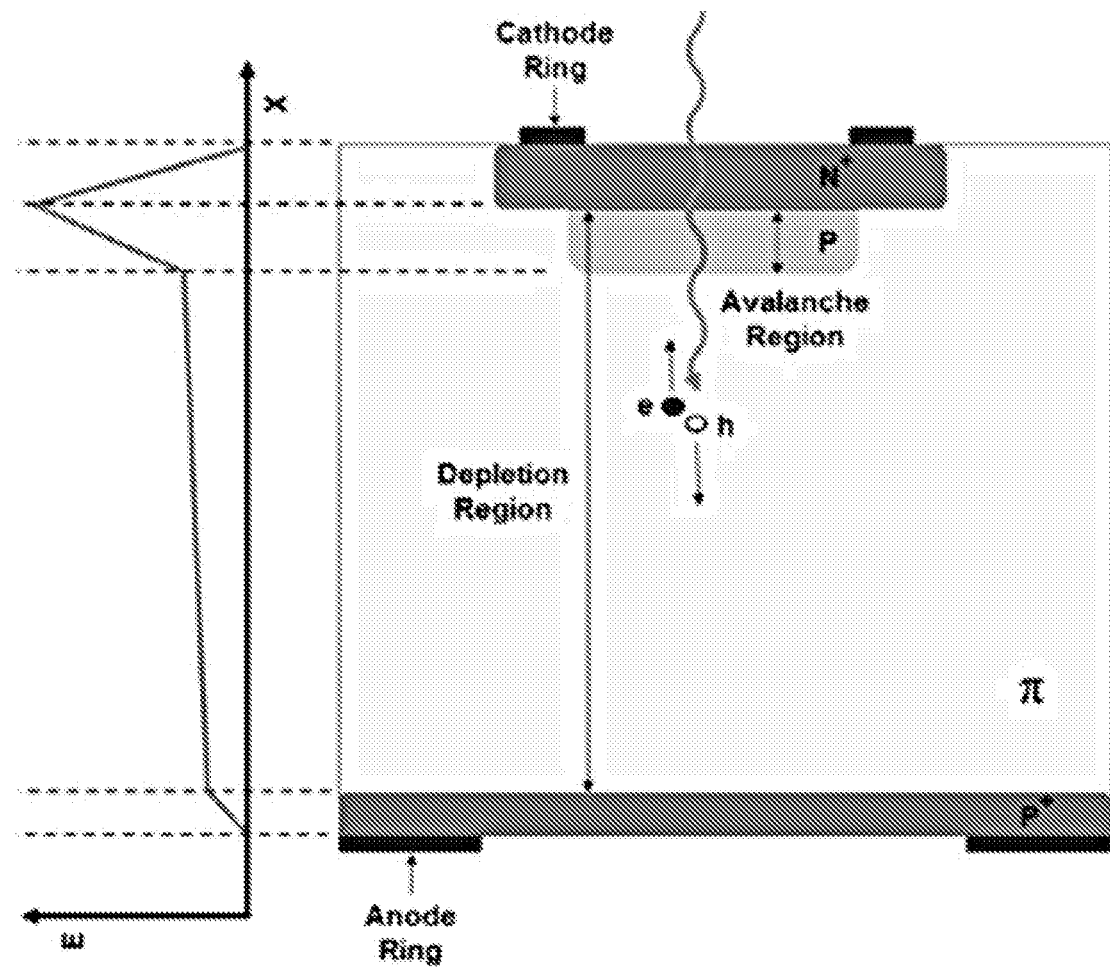
FIG. 2 illustrates an example schematic diagram of an LGAD with different regions and an electric field profile created at an n-p doping region according to various examples described herein. This type of sensor is one of the most commonly used for modern fast timing detectors.
Figure 3:
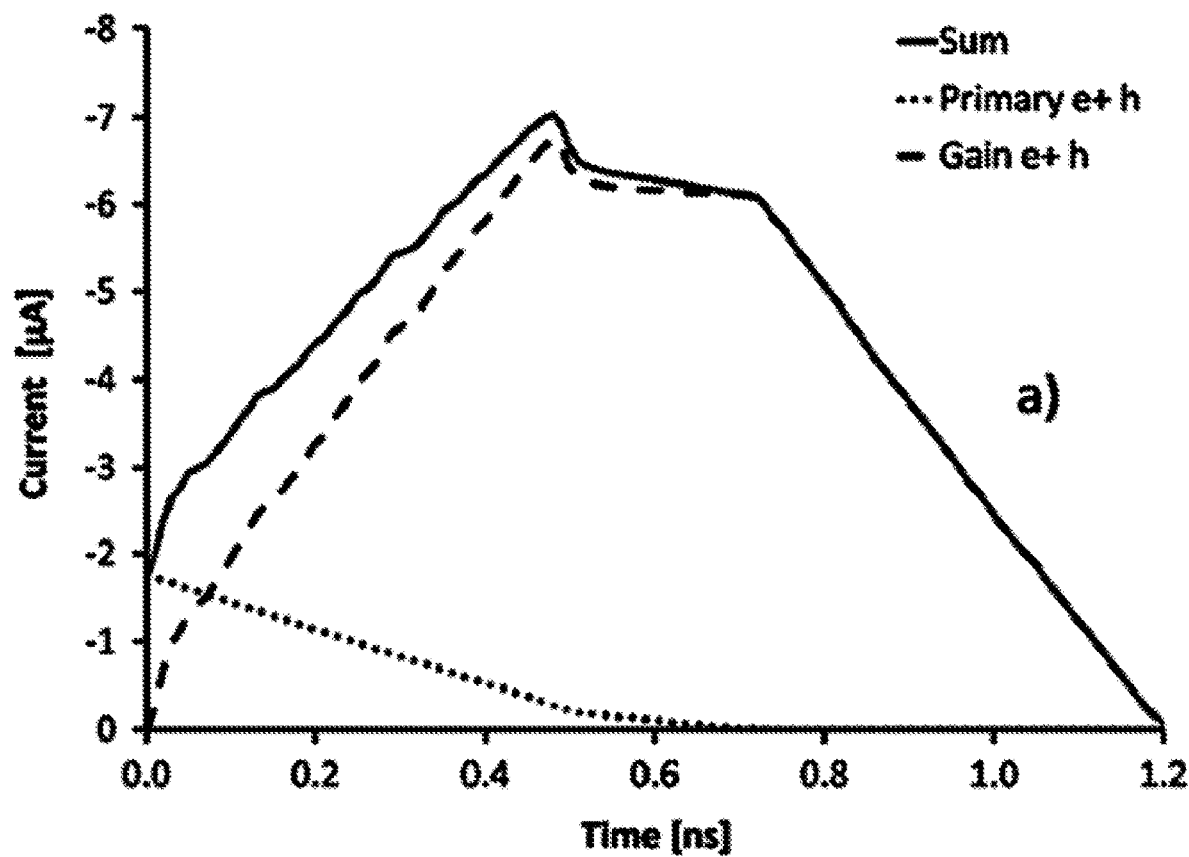
FIG. 3 illustrates an example of a total current signal, primary e-h signal, and signal generated by the creation of additional e-h pairs due to passage of the ionizing particle as simulated by a program according to various examples described herein. Understanding of the signal generated by the available sensors is the first step in the design of front-end electronics.

FIG. 2 illustrates an example schematic diagram of an LGAD with different regions and an electric field profile created at an n-p doping region according to various examples described herein. FIG. 3 illustrates an example of a total current signal, primary e-h signal, and signal generated by the creation of additional e-h pairs due to passage of the ionizing particle as simulated by a program according to various examples described herein. As one example, a simulation program called Weightfield2 (WF2) has been developed to simulate the energy released and the current signal induced by the passage of an ionizing particle by the configuration of parameters such as incident particle, sensor thickness, electric field, gain, and temperature, among other parameters. FIG. 3 shows an example of a current signal simulated by the WF2 program for a UFSD sensor. The current signal is the sum of the primary electron-holes and the newly generated electron-holes from the passage of a particle. The current signal obtained from the detector has a magnitude of the order of micro-amps, as shown in FIG. 3, and needs to be analyzed.

An example chain of electronics to analyze current signals from detectors includes a shaping amplifier, a discriminator, and a digital converter. As one example, a shaping amplifier can have an appropriate input impedance and gain to amplify the signal to a level sufficient to drive the discriminator and other sampling devices, such as SAMpler for PICosecond time (SAMPIC). SAMPIC is a chip used to digitize the analog signal. Then, the digitized signal can be processed offline to measure the exact time of the pulse. The SAMPIC chip requires the input voltage signal to be greater than ~100 mV. As an alternative, a discriminator as the NINO chip can be used. A discriminator compares the input signal (from the amplifier) with a user defined threshold and generates a pulse if the signal crosses the threshold level. Then, a time to digital converter, for example the High Performance Time to Digital Converter (HPTDC), can be used to measure the exact time of the pulse.

Existing solutions to analyze current signals from detectors rely on several boards with sensors, amplifiers and discriminators. Those boards need to be connected externally, increasing the complexity and causing problems such as addition of noise, potential damage to cable and connectors, board stacking considerations, increased testing time, etc.

Figure 4:
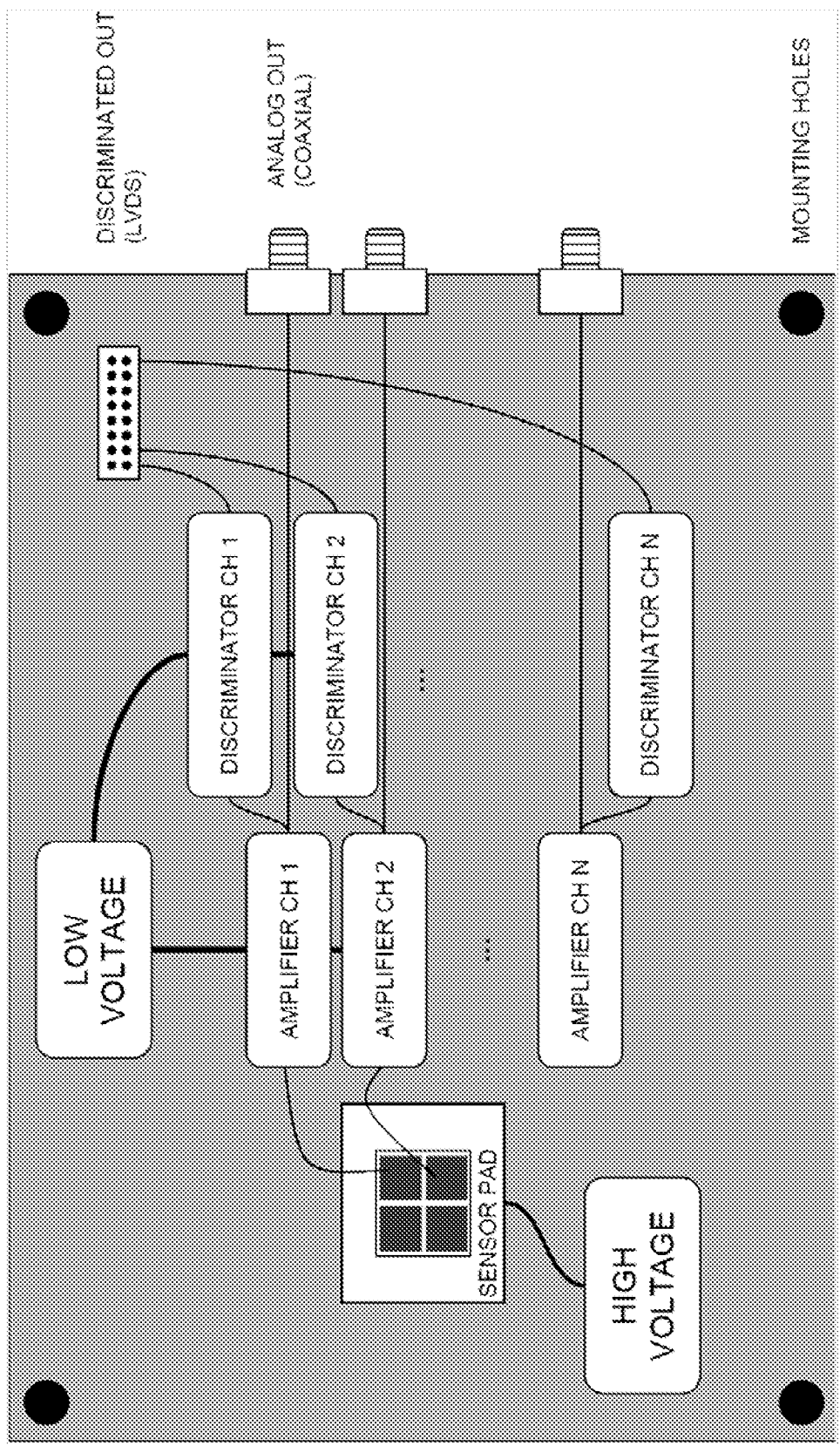
FIG. 4 illustrates an example block diagram of a multipurpose front-end printed circuit board according to various examples described herein.
Figure 5:
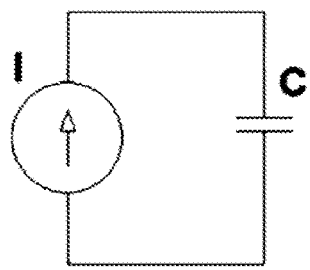
FIG. 5 illustrates an example of a sensor model for simulation according to various examples described herein.

In the context of the problems introduced above, the embodiments described herein focus on the design of a single PCB with the sensors, amplifier, and discriminator arranged together. An example of a block diagram of a multi-purpose front-end printed circuit board according to the embodiments is shown in FIG. 5. The board includes a sensor pad, a multi-channel amplifier, a multi-channel discriminator, a discriminator output connector, coaxial analog outputs, and other circuit components. A sensor can be mounted on the sensor pad for characterization and testing using the board. As shown in FIG. 4, the sensor pad can be connected to the multi-channel amplifier, which is connected to a multi-channel discriminator. The multi-channel discriminator is connected to the discriminator output connector. The discriminator output connector can be read out by a computing device intended to receive and collect the characterization data for the sensor.

The sensor pad can be supplied by a high voltage source, and the various components of the multi-channel amplifier can be supplied with a low voltage power source as shown in FIG. 4. Each channel of the multi-channel amplifier can be individually connected using the respective coaxial analog output. In addition, the discriminated signals can be read out using an LVDS connector, for example a common RJ45.

When an ionizing particle passes through a sensor, positive and negative charges are accumulated on the electrodes of the sensor. For simulation, a solid state sensor is modeled as a current source in parallel with a capacitor as shown in FIG. 5. The properties of current source are tuned so that the signal has a shape similar to that obtained from simulations of the sensor. For example, a current signal with amplitude of 10 µA simulated from the sensor model shown in FIG. 5 is provided in in FIG. 6.

The charge collection time which is the time required for electrons and holes to move towards the cathode and anode respectively is 500 ps for a 50 µm UFSD sensor. When the sensor model shown in FIG. 5 is connected to an amplifier, the input impedance $R_{in}$ of the amplifier in combination with the detector capacitance $C_{det}$ forms a parallel RC circuit. For this exemplary circuit, the time constant $\tau = C_{det} R_{in}$ is the time required to discharge the capacitor through the resistor $R_{in}$, as shown in FIG. 7. If $\tau$ is smaller than the charge collection time, the capacitor will discharge faster, the amplifier will be able to sense the current signal and a large slew rate will be obtained since $$\frac{dV}{dt} \propto \frac{1}{\tau}.$$

For instance, if the detector capacitance has a value of 5 pF and $\tau$ is 500 ps, the input impedance of the amplifier should be lower than 100Ω.

A transimpedance pulse shaping amplifier is used to amplify the current signal and convert it to a voltage signal. Among other circuit elements, the amplifier can be embodied using SiGe (Silicon-Germanium) Heterojunction Bipolar Junction Transistors (HBJT) that operate in active mode. HBJTs are generally used in high speed applications due to their low power consumption and low noise. The desired transimpedance gain $$\frac{V_{out}}{I_{in}}$$

can be higher than 10Ω, so that the output signal would be amplified to an amount that could be read out by sampling devices like the SAMPIC, i.e., at hundreds of millivolts. The amplifier has three stages of amplification which are described below.

The first stage of amplification is used as a pre-amplifier. The main purpose of this stage can be to adapt to the high impedance of the sensor to the low impedance of the following stage, extracting the current signal from the sensor and converingt it to a voltage signal. In this embodiment, while doing so, the stage should be configured to contribute low noise and to not distort the signal.

For use in the first stage of amplification, FIG. 8 illustrates an example HBJT with collector feedback biasing according to various examples described herein. Resistor RB can represent the feedback resistor connected between the collector and base of the transistor. RB can control the amount of current being fed back to the base of the transistor. The input current to the transistor can now be the sum of the signal current from the detector and the feedback back current. The feedback leads to a smaller gain, as shown in Table 2, but in turn increases the bandwidth of operation of the amplifier and also helps to reduce noise and signal distortion. The amplifier can invert and produce a positive voltage signal.

Let the distortion or noise of the amplifier without and with feedback be $\alpha$ and $\alpha_f$. Let the gain and feedback factor be $-G$ and $\beta$. The amount of $\alpha_f$ fed back equal to $\beta\alpha_f$. Therefore, the resultant distortion or noise is $$\alpha_f = \alpha - \beta\alpha_f G = > \alpha_f = \frac{\alpha}{1+\beta G}.$$

Therefore, the distortion or noise due to feedback is reduced due to a factor of 1+βG.

For use in the second stage of amplificaiton, FIG. 9 illustrates an example of HBJT with fixed base biasing according to various examples described herein. The second stage of amplification can further increase the gain and shape the signal. A HBJT common emitter configuration with fixed base biasing is used as one non-limiting example. The amplifier can invert and produce a negative voltage signal. Although the second stage of amplification can provide the desired transimpedance gain above 10 kΩ (Table 2), the output is a negative pulse. Because many discriminators only accept positive input signals, a negative signal is not preferable for use as an input. Thus, the third stage of amplification can invert the negative voltage signal and convert it to a positive voltage signal.

If the third stage of amplification were directly connected to the output of the second stage, a very large signal would be observed at the output of stage 3 and this could lead to distortion of the signal shape. To avoid this, a Pi-pad attenuator, as shown in FIG. 10, is placed between the second and third amplifier stages. The attenuator helps to attenuate the signal from the second stage and impedance match the input and output of the attenuator. The value of attenuation can be chosen such that the magnitude of gain at the output of the attenuator is approximately equal to the magnitude of the gain at the output of the first stage.

An equation to find the resistor values in the attenuator based on desired impedance and attenuation, where $Z_0$=impedance and Att=attenuation, is:

$$R1 = \frac{z_0\left[10^{\frac{Att(dB)}{20}}+1\right]}{\left[10^{\frac{Att(dB)}{20}}-1\right]} \quad R2 = \frac{\frac{z_0}{2}\left[10^{\frac{Att(dB)}{20}}-1\right]}{\left[10^{\frac{Att(dB)}{20}}\right]}. \quad (3)$$

The signal from the attenuator is as the input for the third stage. The third stage can have the same structure as that of the second stage shown in FIG. 9 since the main purpose is just to invert the signal to produce a positive signal with approximately the same gain magnitude as that obtained from stage 2. The output (FIG. 12) from stage 3 will be fed into the positive input of the discriminator and it will also be an output of the PCB.

Figure 11:
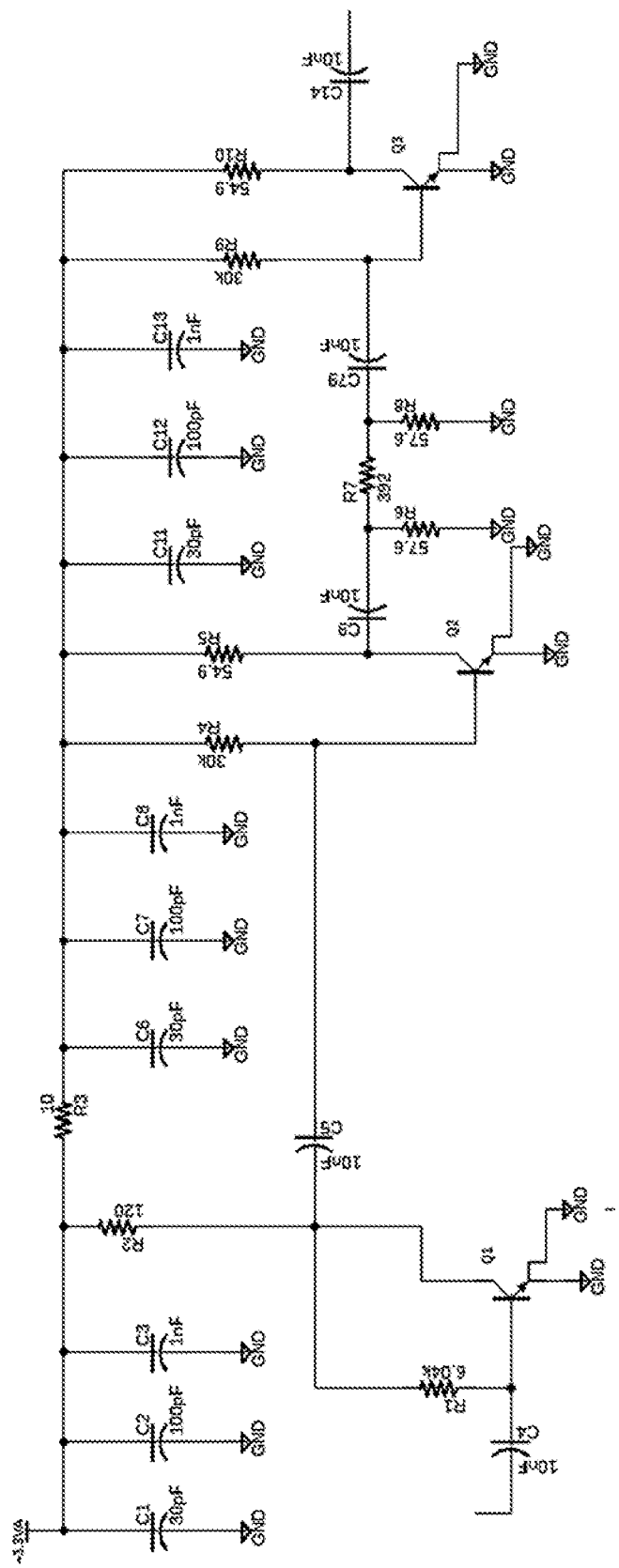
FIG. 11 illustrates an example of a complete 3 stages amplifier circuit according to various examples described herein.

All three stages of the amplifier along with the attenuator are connected as shown in FIG. 11, with resistors and bypass and decoupling capacitors. The values of the components were optimized to provide good time precision. A 3.3V DC voltage supply was used. The DC voltages and currents at the base and collector for each transistor, as obtained from simulation, are summarized in Table 1.

Figure 6:
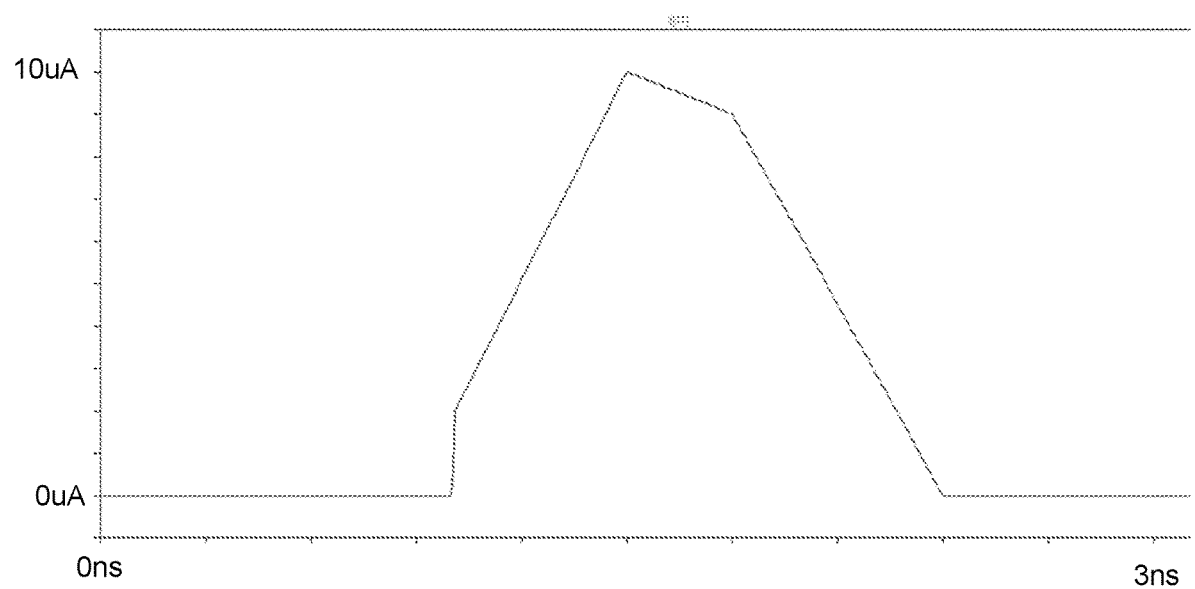
FIG. 6 illustrates an example of a simulated current from a sensor model according to various examples described herein. It is a simplification of the signal shown in FIG. 3 and it is used to optimize the front-end electronics.
Figure 12:
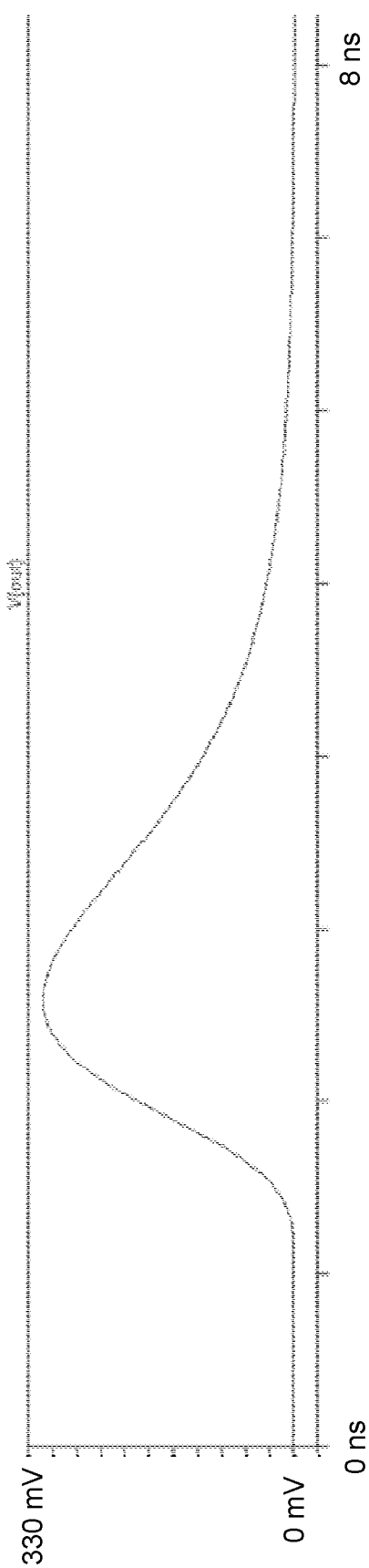
FIG. 12 illustrates an example of an output signal from the amplifier shown in FIG. 11 according to various examples described herein.

FIG. 12 shows the output voltage signal with a peak value of ~300 mV, assuming the current signal shown in FIG. 6 as input. This signal amplitude satisfies the requirement of being above 100 mV in this example configuration. To achieve this, the gain values are summarized in Table 2.

TABLE 2

Gain Summary of Various Stages for the Amplifier

| Stage 1 | Transimpedance Gain ~-2.1 kΩ(V/A) | Positive Output Signal |
|---|---|---|
| Stage 2 | Voltage gain ~-15 (V/V), Transimpedance Gain ~-30 kΩ(V/A) | Negative Output Signal |
| Attenuator | Attenuation ~24 dB, Voltage Gain at output ~0.1 (V/V), Transimpedance Gain at output ~-2.1 kΩ(V/A) | Negative Output Signal |
| Stage 3 | Voltage Gain ~-15 (V/V), Transimpedance Gain ~-30 kΩ(V/A) | Positive Output Signal |

The final transimpedance gain of the amplifier is ~30 kΩ. The input impedance of the amplifier is ~65Ω (satisfies below 100Ω requirement) and output impedance is ~55Ω (value within 10% of 50Ω PCB output traces). The bandwidth of the amplifier is about 450 MHz. The total power consumption for the amplifier including all three stages is approximately 174 mW. The power available for 48 amplifiers is ~10 W so the power for a single amplifier should be below 200 mW.

The time precision was calculated using Equation 2 and was found at ~14 ps for the input current signal shown in FIG. 6. The Signal to Noise Ratio (SNR) was ~60, slew rate ~4.18*10$^8$ V/s, and RMS noise of ~5 mV.

Figure 13:
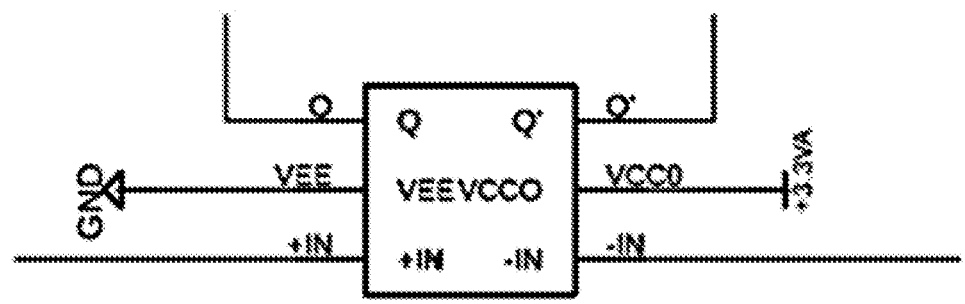
FIG. 13 illustrates an example of a discriminator input, output, and voltage supply pins according to various examples described herein.

Commercially available discriminators or comparators are usually expensive, slow, and have a high-power demand. Furthermore, sometimes they have single ended outputs which cause the output to be more affected by noise and Electro-Magnetic Interference (EMI). Due to these reasons, comparators with LVDS outputs, low power consumption, as well as high speed functionality can be used, such as the LTC6754 or LMH7220 comparators. Both are high speed comparators with low propagation delay and low power consumption. The comparators are designed to drive LVDS loads of 100Ω which is why 50Ω transmission lines are used to route the LVDS outputs to minimize reflections and maintain signal integrity. An example of a discriminator input, output, and voltage supply pins is shown in FIG. 13.

Some comparison parameters are shown in Table 3. It can be observed that both allow the input signal to have an amplitude of –200 mV but anything lower than this would damage the discriminator or cause it to not function appropriately.

TABLE 1

Simulated DC Parameters of HBJT

| Stage | Vbe | Vce | Vbc | Ib | Ic | β | Ie |
|---|---|---|---|---|---|---|---|
| Stage 1 | 0.88 V | 1.2 V | -0.31 V | 53 uA | 17.4 mA | 328 | 17.4 mA |
| Stage 2 | 0.89 V | 1.98 V | -1.08 V | 68.4 uA | 17.6 mA | 257 | 17.6 mA |
| Stage 3 | 0.89 V | 1.98 V | -1.08 V | 68.4 uA | 17.6 mA | 257 | 17.6 mA |

TABLE 3

Comparison of LTC6754 and LMH7220 Parameters

| Parameter | LTC6754 | LMH7220 |
|---|---|---|
| Voltage Range on Input Pins | Vsupply(+0.1 V)-GND(−0.2 V) | Vsupply(+0.2 V)-GND(−0.2 V) |
| Propagation delay | 1.8 ns | 2.9 ns |
| Maximum speed | ~555 MHz | ~345 MHz |
| Common Mode Voltage | 1.26 V | 1.22 V |
| Differential Voltage | 360 mV | 325 mV |

Figure 14:
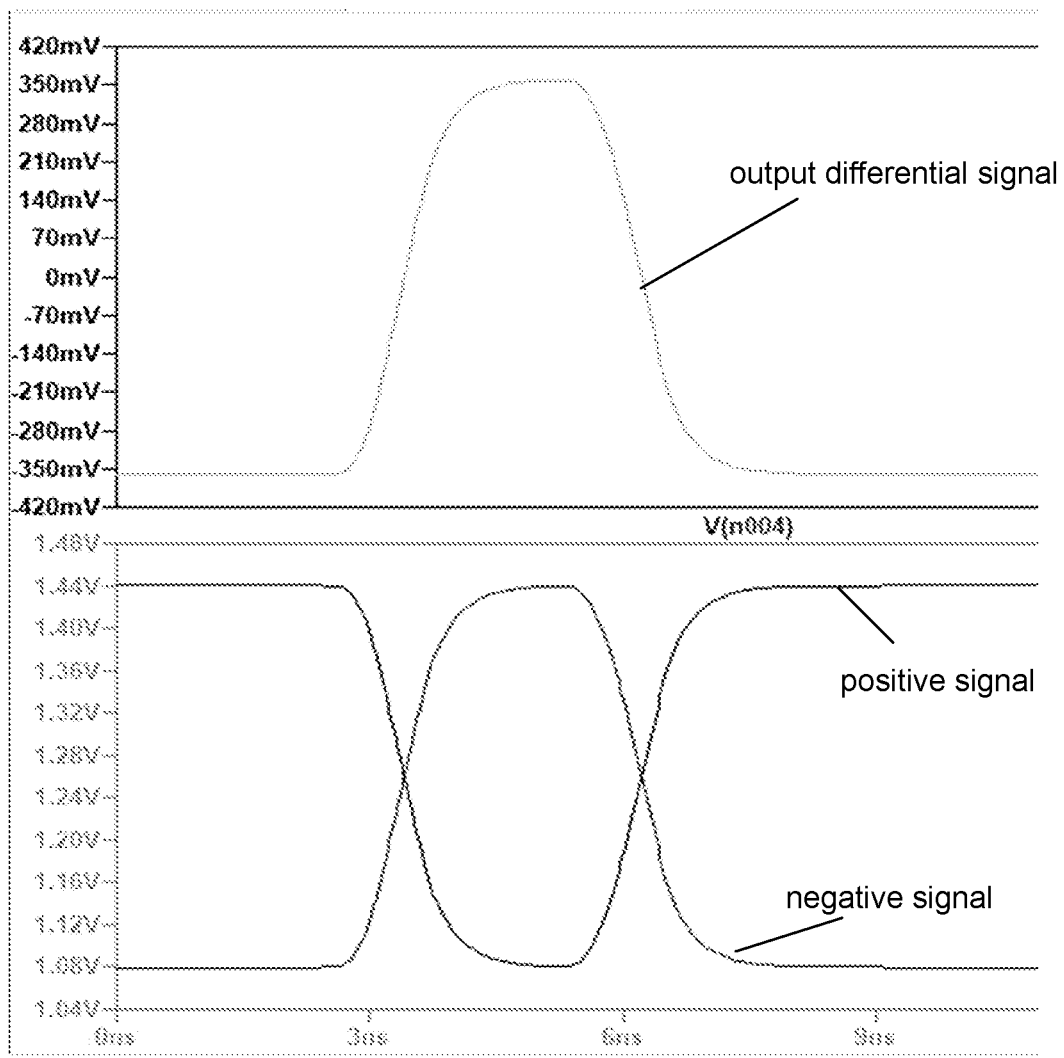
FIG. 14 illustrates an example of an output differential signal from an LT discriminator obtained by taking the difference between the positive and negative signal according to various examples described herein.

The LTC6754 comparator was used for simulation. The positive input (+IN) was connected to the output of the third amplifier stage. The negative input (−IN) was connected to a threshold voltage for comparison. The threshold voltage is controlled by a potentiometer on the PCB. The potentiometer is implemented as voltage divider between 3.3 V and ground. Simulated output (+Q and −Q) signal from LTC6754 is shown in FIG. 14. The output high voltage (VOH) and low voltage (VOL) are 1.44 V and 1.08 V respectively. This results in common and differential voltage of 1.26 V and 360 mV as shown in Table 3, where Common Mode $$\text{Voltage} = \frac{(V_{OH} + V_{OL})}{2}$$

and Differential Voltage=$V_{OH}$-$V_{OL}$.

Any suitable connectors, such as RJ45 connectors, can be used to output the LVDS signals from the PCB. The differential pairs from the comparators can be connected to the output pins of the RJ45 connector based on the twisted pair arrangement of a Cat6 (used for frequencies in the GHz range) ethernet.

Figure 15:
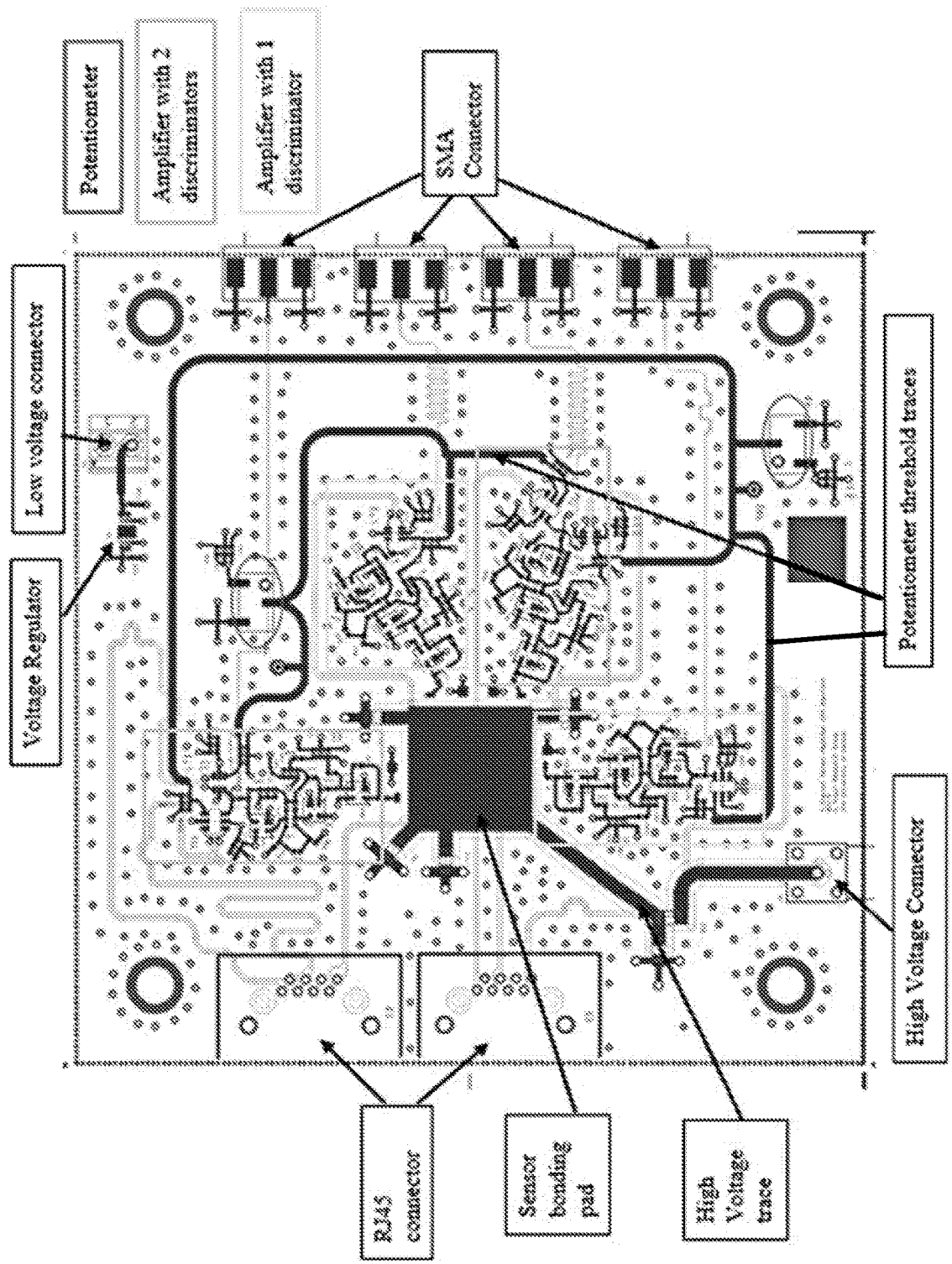
FIG. 15 illustrates an example printed circuit board layout, according to various examples described herein.

FIG. 15 illustrates an example PCB layout, according to various examples described herein. In this example, the PCB is a 6-layer board with dimensions of 4.003 in×4.125 in. The board incorporates four amplifiers. The amplifiers can have different discriminators connected to the amplifier outputs to compare the performance of the discriminators. The resistors and capacitors have surface mount packages which facilitates a compact design. Bypass and decoupling capacitors that provide low Equivalent Series Inductance (ESL) and Equivalent Series Resistance (ESR) can be used.

The PCB can distribute a bias potential up to 1 kV through the sensor bonding pad (1.5 in×2 in) on which the UFSD sensors are placed, using conductive glue. The glued sensors can then be wire bonded to smaller sensor pads connected to the amplifier and ground pads. The main function of the first stage of the amplifier, which is also regarded as a preamplifier, is to extract the signal from the sensor with low noise and low distortion. Due to this, the first stage is placed as close as possible to the sensor bonding pad and the trace connecting them is relatively short and thin, so it has low capacitance. The amplifier as a whole has a compact design and the components are placed close together to minimize trace length, effect of external factors, and noise. The bias voltage up to 1 kV is supplied to the sensor bonding pad through a thick trace so that it has low impedance. This trace also has a larger clearance around it to limit the leakage current toward the ground copper pour surrounding the trace.

The low 3.3 V voltage can be achieved with the help of a regulator and is passed on to a power plane. There are two sets of trim potentiometers to maintain and change the threshold voltages of the discriminators. The traces connecting the potentiometers and the discriminators are again thick to have low impedance. There are also two sets of controlled impedance traces (output from amplifier and output from discriminator) on the PCB. The trace width to achieve the desired impedances was calculated using standard impedance simulators.

TABLE 4

Type of Trace and Parameters to Achieve Desired Impedance

| Type of Trace | Impedance | Output | Width | Spacing | Thickness |
|---|---|---|---|---|---|
| Stripline Single Ended | 50 Ω | From amplifier (stage 3) | 10 mil | — | 0.7 mil |
| Stripline Differential | 100 Ω (differential impedance) | From discriminator | 8 mil | 11 mil | 0.7 mil |

Differential traces were symmetrically routed to reduce EMI effects and minimize signal reflections. Additionally, all trace turns had a smooth curvature rather than 90 degree turns to minimize signal reflections.

FIG. 16 illustrates an example stackup of the multipurpose front-end circuit board according to various examples described herein. Unused areas of the board are grounded and ground vias are distributed across the board to reduce effects of crosstalk and return path current. Vias can also be used to stich the planes together. Power and ground planes can be adjacent to each other and the signal routing layer is placed between ground planes.

Figure 17:
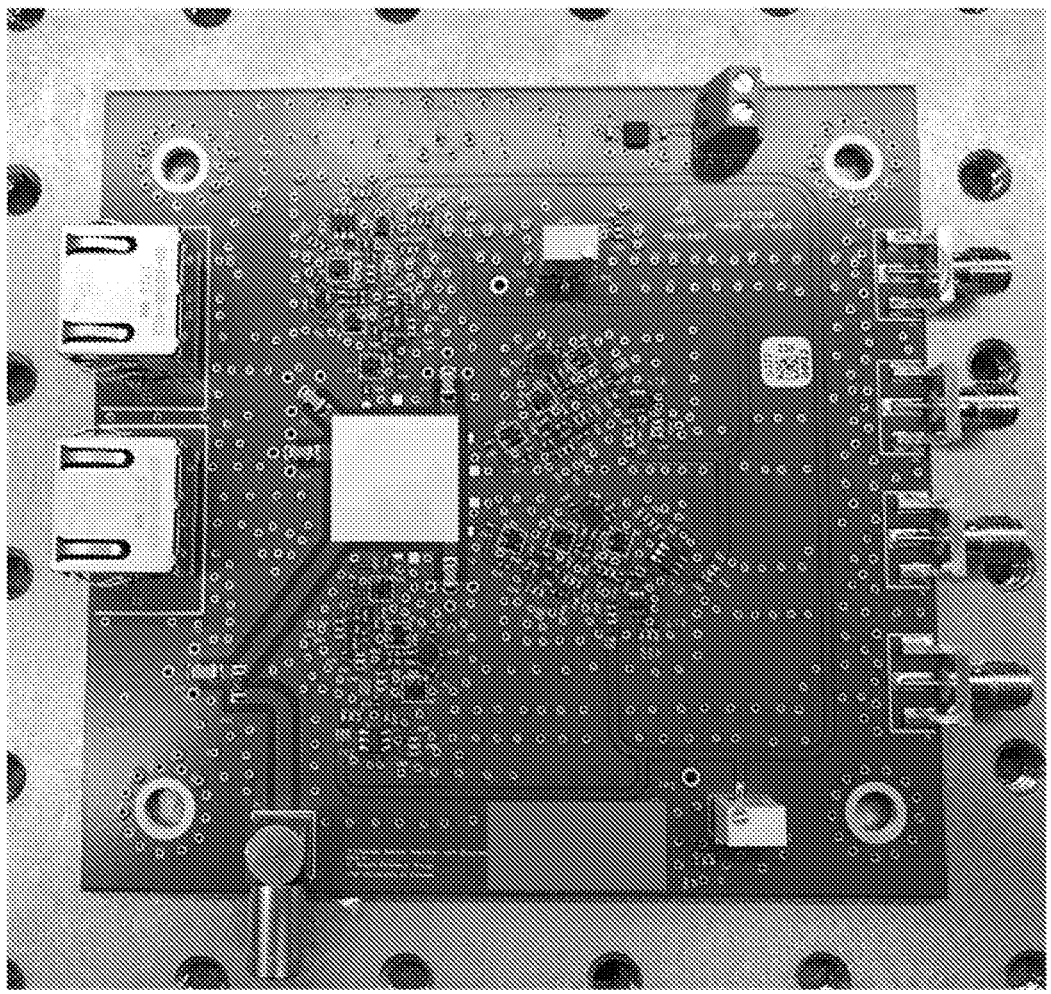
FIG. 17 illustrates an example of a manufactured printed circuit board according to various examples described herein.

The PCB was manufactured, and some tests were performed to test the functionality of the board. FIG. 17 illustrates an example of the PCB according to various examples described herein. The tests that were performed include power, noise, DC voltages and current measurements for HBJTs. Furthermore, the discriminators were tested using a signal generator to produce a pulse that would be used as an input to the discriminators. Two single ended probes were connected to the LVDS outputs of the discriminator and the signals were read on an oscilloscope. The difference between both signals was taken to obtain a waveform of the differential signal.

The high voltage supply was set to deliver a bias voltage of 1 kV with a current limit set to 0.01 μA. A low voltage supply was set to deliver a voltage of 4.5 V and the current absorbed by the board is ~300 mA. The power consumption for the entire board consisting of the 4 amplifiers, discriminators, and potentiometers is ~1.3 W. The RMS noise for the circuit consisting of amplifier and discriminator measured with an oscilloscope is found to be ~5 mV.

The DC voltages were measured using a voltmeter and the results along with the error with respect to simulation values are presented in Table 5 and Table 6 respectively. All measured values are within 10% of the simulated values. The simulated values resulted in a input impedance of ~65Ω and output impedance of ~55Ω.

TABLE 5

Measured DC parameters of HBJTs

| Stage | Vbe | Vce | Vbc | Ib | Ic | β | Ie |
|---|---|---|---|---|---|---|---|
| Stage 1 | 0.835 V | 1.156 V | −0.321 V | 53.5 uA | 17.37 mA | 325 | 17.42 mA |
| Stage 2 | 0.818 V | 1.928 V | −1.11 V | 69.4 uA | 17.67 mA | 255 | 17.74 mA |
| Stage 3 | 0.818 V | 1.925 V | −1.11 V | 69.4 uA | 17.72 mA | 255 | 17.79 mA |

TABLE 6

Error between simulated and measured values of DC Parameters of BJT

| Stage | Vbe | Vce | Vbc | Ib | Ic | β | Ie |
|---|---|---|---|---|---|---|---|
| Stage 1 | 5.11% | 3.67% | 3.55% | 0.94% | 0.17% | 0.91% | 0.11% |
| Stage 2 | 8.09% | 2.63% | 2.78% | 1.46% | 0.40% | 0.78% | 0.80% |
| Stage 3 | 8.09% | 2.78% | 2.78% | 1.46% | 0.68% | 0.78% | 1.08% |

Figure 18:
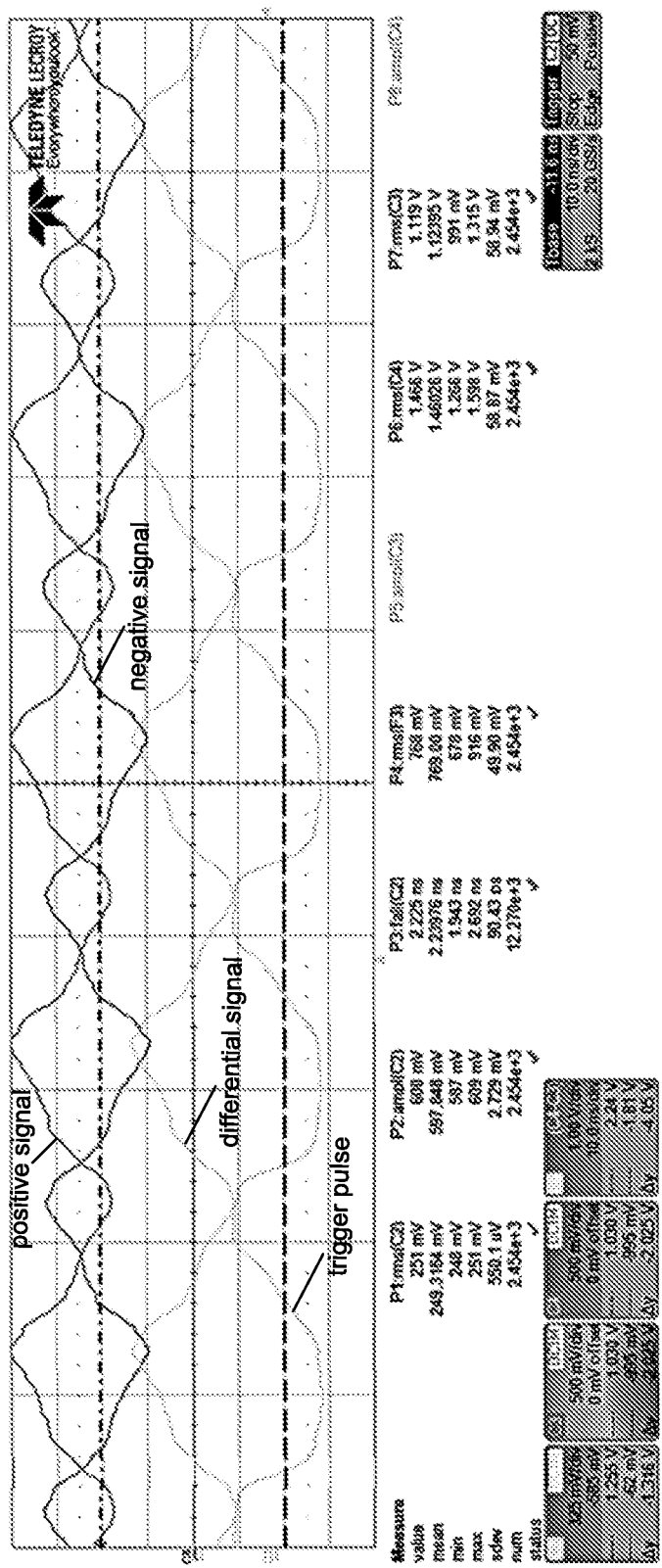
FIG. 18 illustrates an example of a result from an LT discriminator according to various examples described herein.
Figure 19:
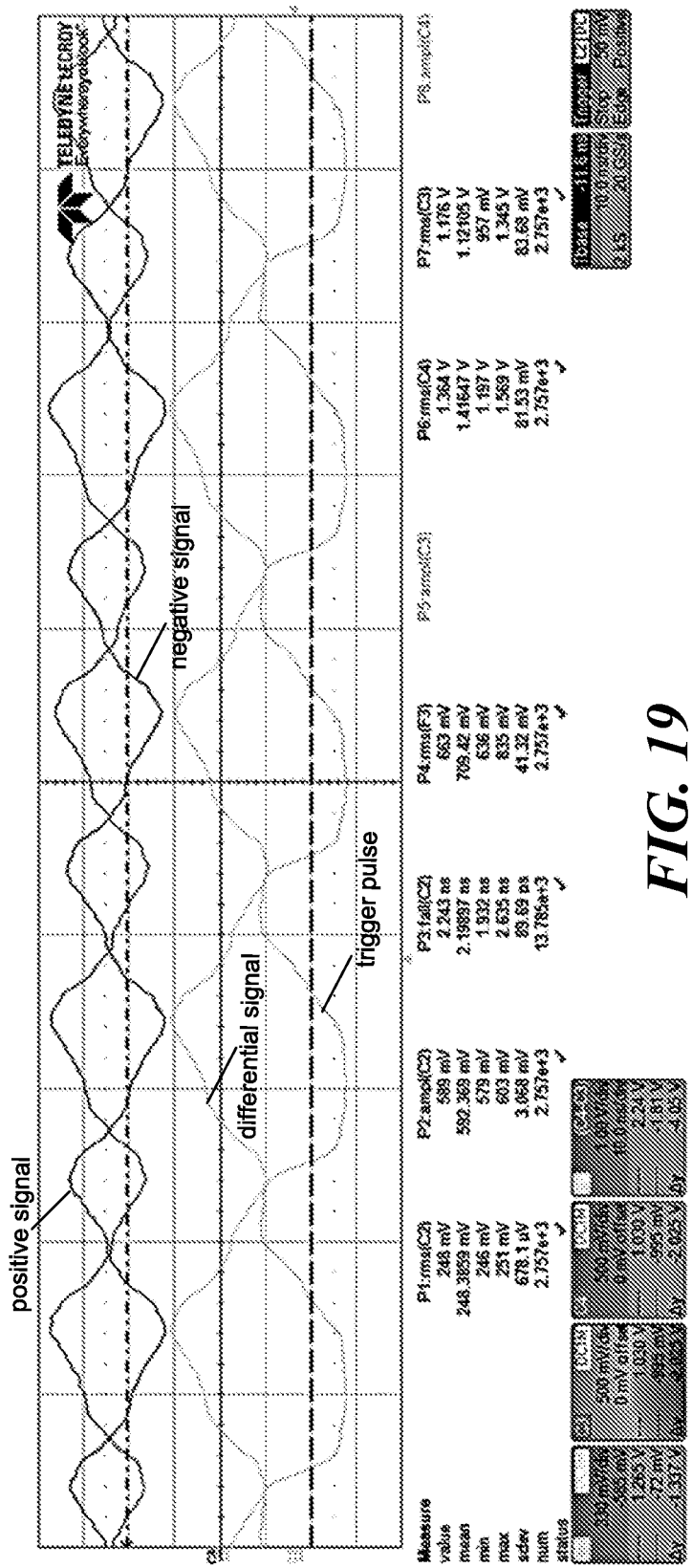
FIG. 19 illustrates an example of a result from a TI discriminator according to various examples described herein.

A pulse with amplitude of ~300 mVpp, frequency ~50 MHz, and rise time of 1.5 ns was used as the input to the discriminators. The differential signals obtained from both the LT and TI discriminators can be observed in FIG. 18 and FIG. 19, respectively. The threshold for both discriminators was set to ~120 mV.

The measured values of the common mode voltage and differential voltage for the LT and TI discriminator along with the error with respect to the expected values (Table 3) are shown in Table 7 and Table 8 respectively.

TABLE 7

Measured parameters of discriminators

| Parameter | LTC6754 | LMH7220 |
|---|---|---|
| Common Mode Voltage | 1.29 V | 340 mV |
| Differential Mode | 1.27 V | 300 mV |

TABLE 8

Error between measured and theoretical parameters of discriminators

| Parameter | LTC6754 | LMH7220 |
|---|---|---|
| Common Mode Voltage | 2.39% | 5.56% |
| Differential Mode | 4.95% | 7.69% |

Both discriminators successfully produce a differential signal when the threshold is crossed and function at high frequencies. The percentage error for the common mode and differential mode voltages is within 10%. Although, LTC6754 appears to have a lower error compared to LMH7220. As rule of thumb, a 10% error should be acceptable and either can be used in future designs depending on the maximum speed desired (Table 3).

In this disclosure it is described a circuit schematic and board layout for a circuit that would amplify, shape and discriminate the signal obtained from a solid state sensor. A circuit consisting of 3 stages of a pulse shaping transimpedance amplifier was successfully designed using a simulation software. Simulation results suggest that the amplifier provides an input impedance of ~65Ω which leads to a time constant τ~325 ps (for detector capacitance of 5 pF) that is smaller than the charge collection time of ~500 ps for a 50 μm thick silicon sensor. The small time constant enables the sensor, which acts like a capacitor, to discharge faster and have a higher slew rate. The 3 stages of the shaping amplifier convert the test input current signal of amplitude ~10 μA from the sensor to a voltage signal of amplitude ~300 mV. Simulation results suggest that the transimpedance gain was ~30 W, power consumption ~174 mW, bandwidth ~450 MHz, SNR ~60, and time precision down to ~14 ps. The output voltage signal from the amplifier was used as the input of two different discriminators which provide low noise, low power consumption, LVDS outputs and high-speed functionality. Simulation results showed discriminator functionalities and that they produce LVDS outputs that have a common mode and differential voltage of 1.26 V and 360 mV respectively.

A 6-layer PCB that allows for the placement of sensors, four amplifiers, and four discriminators was successfully designed and manufactured. Components of package size 0402 were used to create a compact design to reduce effects of noise, external factors, and minimize trace length. Trace thicknesses were adjusted according to the requirements of low capacitance or low impedance. 50Ω impedance and 100Ω differential impedance-controlled traces for outputs from the amplifier and discriminator respectively were designed by optimizing the dielectric thickness, trace width, thickness and spacing (for differential traces). Unused areas of the circuit board were grounded, and power and signal layers had ground layers between them to reduce effects of crosstalk, return path current and provide low impedance path to ground for bypass capacitors.

The manufactured board was produced and tested. HBJT parameters such as the DC voltages and currents were compared against their simulated values. The parameters matched their simulated values with an error that was below 10%. Measured input impedance was ~65Ω and output impedance ~55Ω. Using a high frequency pulse generator, the functionalities of the discriminators was tested. The discriminators successfully produced a differential signal when the pulse crossed the set threshold of ~120 mV with the common mode and differential mode voltages producing an error below 10% on comparing with the theoretical values. The board can be tested by incorporating a variety of sensors and reading the LVDS output from the discriminators using a HPTDC.

Figure 20:
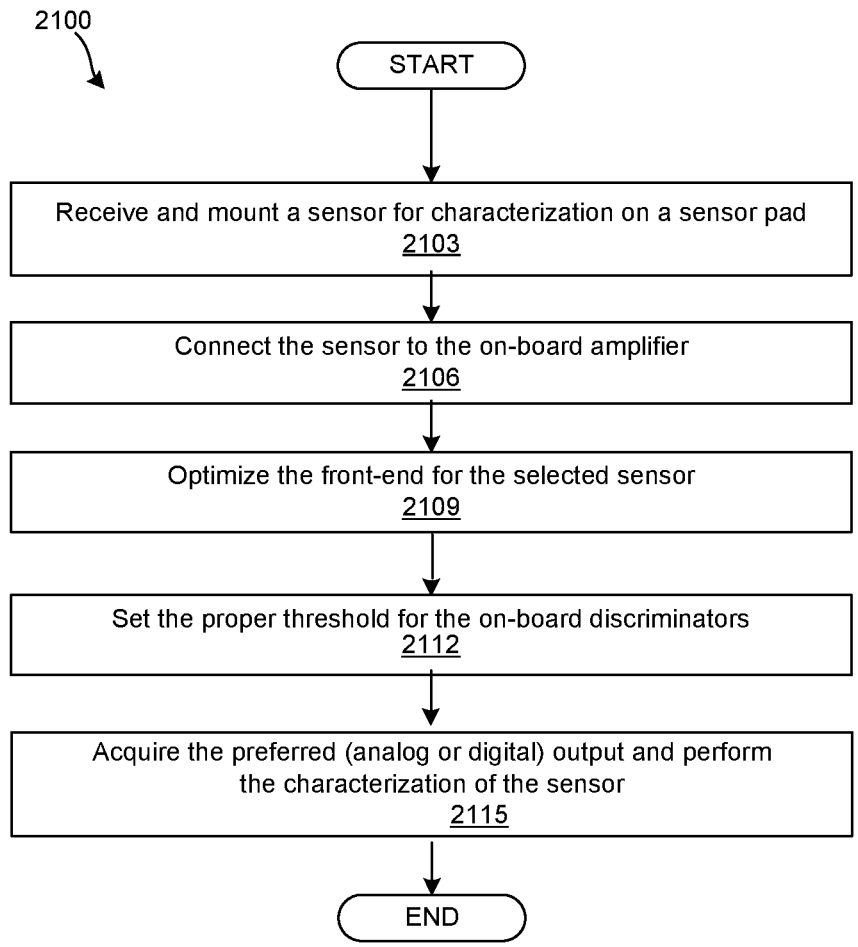
FIG. 20 is a flow chart depicting the operation of an exemplary Multipurpose Front-End board configured for characterizing sensors according to various examples described herein.

Moving on to FIG. 20, shown is a flowchart depicting an example of operation of a multipurpose front-end board configured for characterizing sensor. It is understood that the flowchart of FIG. 20 provides merely an example of the many different types of functional arrangements that can be employed to implement portions of the operations of the printed circuit board as described herein.

Beginning with step 2103, a process 2100 of operations for a front-end characterization board can include receiving and mounting a sensor for characterization on a sensor pad. The front-end characterization board can include a sensor pad, an amplifier, a discriminator, and other suitable characterization components.

At step 2106, the process 2100 can involve providing, by way of a bonding wire, the current signal produced by the sensor to the amplifier. In one embodiment, the amplifier can comprise a first stage circuit, a second stage circuit, and a third stage circuit. An input of the first stage circuit can be electrically coupled to an output of the sensor pad. An output of the first stage circuit can be electrically coupled to an input of the second stage circuit. In some embodiments, an output of the second stage circuit is electrically coupled to an attenuator, which in turn is coupled to an input of the third stage circuit.

At step 2109, the process 2100 can involve optimizing the amplifier. For example, to tune the input impedance of the pre-amplifier to the capacitance of the sensor. At step 2109, the process 2100 can also involve receiving, via the first stage circuit, the current signal of the sensor and converting the current signal to a voltage signal. The first stage circuit of the amplifier may comprise a common emitter transistor with collector feedback biasing.

At step 2112, the process 2100 can involve the tuning of the thresholds of the discriminators. This step depends on the optimization done during step 2109. At step 2112, the process 2100 can also involve amplifying, via the second stage circuit, the voltage signal. The second stage circuit of the amplifier may include a common emitter with fixed based biasing.

At step 2115, the process 2110 can involve using the analog and/or digital outputs of the multipurpose front-end board to perform the characterization of the sensor. At step 2115, the process 2100 can also involve inverting, via the third stage circuit, the amplified voltage signal. The third stage circuit may include a third common emitter transistor configured with fixed based biasing. The second stage circuit and third stage circuit components can be used to amplify and shape the voltage signal in preparation for the discriminator. The inverted amplifier voltage signal can be supplied to the discriminator.

Further, in some embodiments, the process 2110 can also another step that involves generating, via the discriminator, characterization data from the inverted voltage signal. The discriminator can be configured to compare the inverted voltage signal to a voltage threshold. The voltage threshold can be generated from a potentiometer coupled to the discriminator.

The above-described examples of the present disclosure are merely possible examples of implementations set forth for a clear understanding of the principles of the disclosure. Many variations and modifications can be made without departing substantially from the spirit and principles of the disclosure. All such modifications and variations are intended to be included herein within the scope of this disclosure and protected by the following claims.

The invention claimed is:

1. A characterization front-end printed circuit board apparatus, comprising:
   a sensor pad to mount a particle detection sensor for characterization and provide a current signal produced by the particle detection sensor;
   a multi-stage amplifier electrically coupled to the sensor pad, the multi-stage amplifier comprising:
      a first stage amplifier circuit configured to receive the current signal and convert the current signal to a voltage signal;
      a second stage amplifier circuit configured to receive the voltage signal from the first stage amplifier circuit and produce an amplified voltage signal;
      a third stage amplifier circuit configured to receive the amplified voltage signal from the second stage amplifier, the third stage amplifier circuit being configured to invert the amplified voltage signal and produce an output voltage signal; and
   a discriminator electrically coupled to the third stage amplifier circuit, the discriminator configured to receive the output voltage signal and generate characterization data based on a comparison between the output voltage signal and a voltage threshold.

2. The printed circuit board apparatus of claim 1, further comprising an attenuator configured to electrically couple the second stage amplifier circuit to the third stage amplifier circuit.

3. The printed circuit board apparatus of claim 1, further comprising:
   a connector electrically coupled to the discriminator to provide the characterization data for storage and analysis; and
   a coaxial connector electrically coupled to the third stage amplifier circuit to provide the output voltage signal in analog form for evaluation.

4. The printed circuit board apparatus of claim 1, further comprising a potentiometer configured to control the voltage threshold of the discriminator.

5. A characterization front-end board, comprising:
   a sensor pad configured to house a sensor to be characterized, distribute a bias potential, and communicate a current signal produced by the sensor;
   an amplifier configured to receive the current signal from the sensor pad and convert the current signal to an output voltage signal, wherein the amplifier comprises:
      a first stage amplifier having an input impedance below a threshold, the first stage amplifier comprising a first common emitter transistor configured with collector feedback biasing and a feedback resistor connected between a collector and a base of the first common emitter transistor, the first stage amplifier being configured to produce a first voltage signal and measure a transpedence gain based on the first voltage signal divided by the current signal;

a second stage amplifier comprising a second common emitter transistor configured with fixed base biasing, the second stage amplifier being configured to produce a second voltage signal;

an attenuator configured to match impedance of an attenuator input signal, wherein a value of attenuation is configured to provide a magnitude of gain approximately equal to the transpedence gain of the first stage amplifier; and a third stage amplifier comprising a third common emitter transistor configured with fixed base biasing and to receive and invert an attenuator output signal;

a discriminator configured to receive the output voltage signal from the amplifier, wherein a threshold voltage of the discriminator is controlled by a potentiometer; and at least one output port to provide data for characterization of the sensor.

6. The characterization front-end board of claim 5, wherein the first stage amplifier is positioned at a distance from the sensor pad to minimize input capacitance.

7. The characterization front-end board of claim 5, wherein conducting traces in the characterization front-end board are configured to minimize impedance and noise.

8. The characterization front-end board of claim 5, further comprising a voltage regulator configured to control a voltage supply to the discriminator.

9. The characterization front-end board of claim 5, further comprising the sensor, wherein the sensor is a solid-state sensor for particle detection.

10. The characterization front-end board of claim 5, wherein the sensor comprises at least one of an ultra-fast silicon detector or a low-gain avalanche detector.

11. The characterization front-end board of claim 5, wherein the at least one output port provides an analog output signal to be analyzed on an oscilloscope.

12. The characterization front-end board of claim 5, wherein the at least one output port provides the data for characterization in a digital format for timing measurements or particle counting at high rates.

13. The characterization front-end board of claim 5, wherein bias and amplification are optimized for the sensor.

14. A method of generating characterization data for a sensor, comprising:

mounting a sensor for characterization on a sensor pad of a single printed circuit board, wherein the single printed circuit board comprises the sensor pad, an amplifier, and a discriminator, wherein the amplifier comprises:

a first stage amplifier circuit that includes a first common emitter transistor with collector feedback biasing;

a second stage amplifier circuit that includes a second common emitter transistor with fixed based biasing;

a third stage amplifier circuit that includes a third common emitter transistor configured with fixed based biasing; and an attenuator that electrically couples the second stage amplifier circuit to the third stage amplifier circuit;

providing, via the sensor pad, a current signal produced by the sensor to the amplifier;

converting, via the amplifier, the current signal to a voltage signal;

generating, via the amplifier, an amplified voltage signal by amplifying the voltage signal;

generating, via the amplifier, an output voltage signal by inverting the amplified voltage signal; and generating, via the discriminator, data for characterization of the sensor by comparing the output voltage signal and a threshold voltage.

15. The method of claim 14, further comprising adjusting the threshold voltage by adjusting a potentiometer coupled to the discriminator.

16. A method of generating characterization data for a sensor, comprising:

mounting a sensor for characterization on a sensor pad of a single printed circuit board, wherein the single printed circuit board comprises the sensor pad, an amplifier, and a discriminator, wherein the amplifier comprises:

a first stage amplifier circuit that includes a first common emitter transistor with collector feedback biasing, wherein the first stage amplifier circuit further comprises a feedback resistor connected between a collector and a base of the first common emitter transistor; and a second stage amplifier circuit that includes a second common emitter transistor with fixed based biasing;

providing, via the sensor pad, a current signal produced by the sensor to the amplifier;

converting, via the amplifier, the current signal to a voltage signal;

generating, via the amplifier, an amplified voltage signal by amplifying the voltage signal;

generating, via the amplifier, an output voltage signal by inverting the amplified voltage signal; and generating, via the discriminator, data for characterization of the sensor by comparing the output voltage signal and a threshold voltage.

17. The method of claim 16, wherein the amplifier further comprises a third stage amplifier circuit that includes a third common emitter transistor configured with fixed based biasing.

18. The method of claim 16, further comprising adjusting the threshold voltage by adjusting a potentiometer coupled to the discriminator.

* * * * *